United States Patent

Park

[11] Patent Number: 6,144,605
[45] Date of Patent: Nov. 7, 2000

[54] REFRESH CIRCUIT FOR SDRAM

[75] Inventor: Kyung-Nam Park, Cheongju, Rep. of Korea

[73] Assignee: Hyundai Electronics Industries Co., Ltd., Kyoungki-Do, Rep. of Korea

[21] Appl. No.: 09/382,786

[22] Filed: Aug. 25, 1999

[30] Foreign Application Priority Data

Mar. 22, 1999 [KR] Rep. of Korea .................. 99-9683

[51] Int. Cl.$^7$ ....................................... G11C 7/00
[52] U.S. Cl. ............................................. 365/222
[58] Field of Search ................................ 365/222, 236

[56] References Cited

U.S. PATENT DOCUMENTS 5,862,093  1/1999  Sakakibara .................. 365/222

*Primary Examiner*—Amir Zarabian
*Assistant Examiner*—VanThu Nguyen

[57] ABSTRACT

The refresh circuit for the SDRAM includes: a control signal input buffer for synchronizing externally inputted signals and a column operation control signal (DQM) with a predetermined clock signal and outputting resultant signals; a command generating unit for generating a first refresh command or a second refresh command by receiving a logic combination signal of the signals supplied from the control signal input buffer in accordance with the column operation control signal; a row activating unit for generating a control signal to activate a row operation in accordance with the first refresh command or the second refresh command; a row activation controlling unit for controlling the row activating unit; an internal address counter for generating a predetermined internal address in accordance with the first refresh command; an external address path for receiving an address of a wordline to be refreshed; a row pre-decoder for receiving the internal address from the internal address counter or the external address supplied via the external address path and decoding the received signal to a row address signal of a predetermined bit; a wordline model signal generating unit for generating a wordline model signal when an actual wordline is selected in accordance with the first or second refresh command; and a sense amp state predicting unit for generating a predetermined signal which indicates a sensing degree of a sense amp after a predetermined time has elapsed from a point when the wordline model signal is inputted.

5 Claims, 3 Drawing Sheets

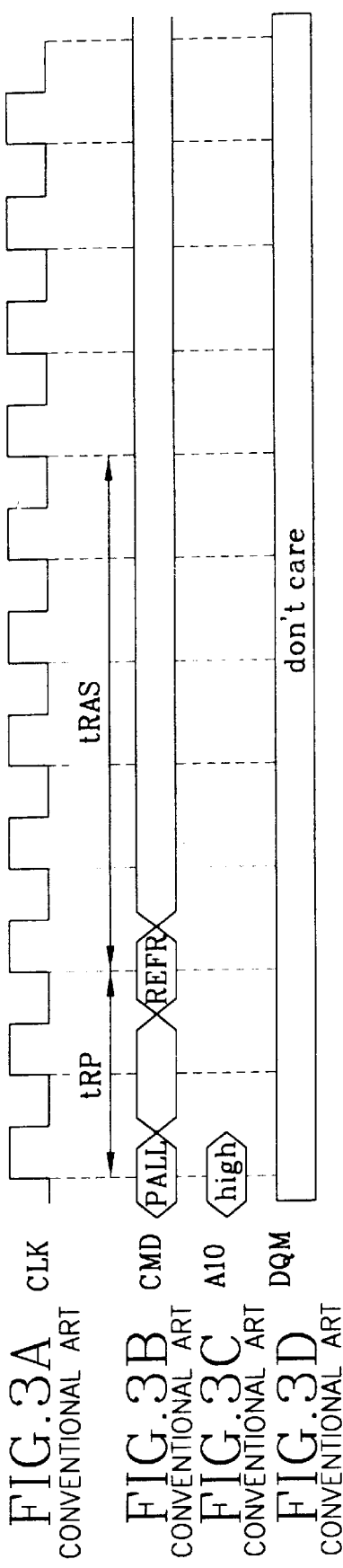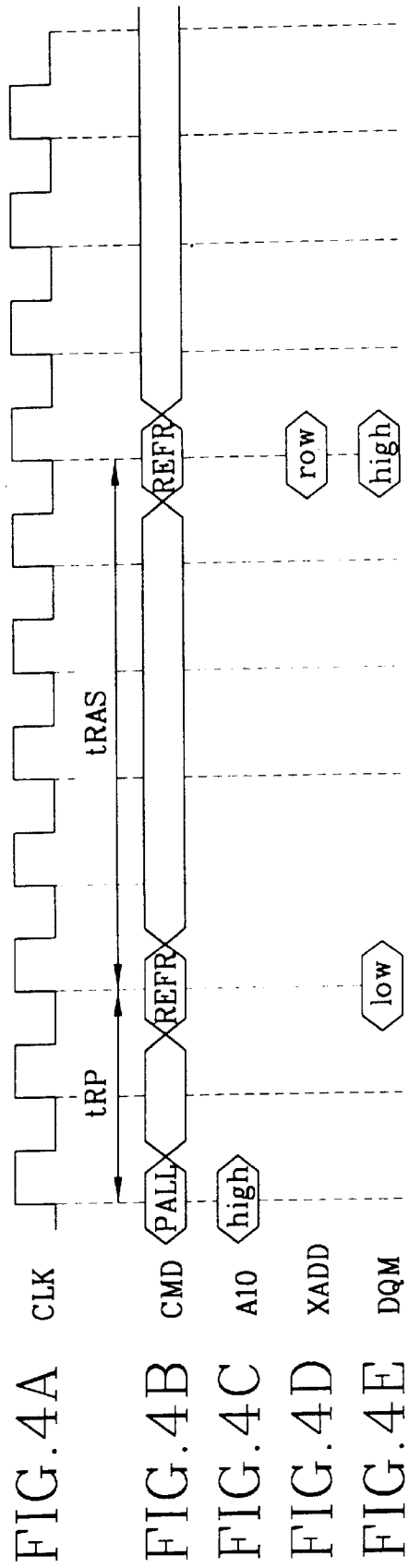

REFRESH CIRCUIT FOR SDRAM

BACKGROUND OF THE INVENTION

1. Field of the Invention

The present invention relates to a synchronous dynamic random access memory (SDRAM), and more particularly to a refresh circuit for an SDRAM.

2. Description of the Conventional Art

Generally, a refresh operation of a dynamic random access memory (DRAM) standard has two methods, that is a RAS (row address strobe)-only-refresh and an automatic (CAS(column address strobe)-before-RAS: CBR) refresh. The RAS-only-refresh is executed, after externally applying a refresh address, in 1 cycle in which a /RAS signal falls and then rises, and in the automatic refresh an address counter installed in a DRAM generates a predetermined internal address instead of externally applying the refresh address, thereby performing the refreshing of the DRAM.

The SDRAM which is a kind of the DRAM also requires a refreshing process and for the refresh operation of the SDRAM the automatic (CBR) refresh is set under the JEDEC standard.

FIG. 1 schematically illustrates a refresh circuit of a conventional SDRAM for performing the automatic refresh. As shown therein, the conventional refresh circuit includes: a control signal input buffer 11 outputting externally applied control signals, such as /RAS (row address strobe bar), /CAS (column address strobe bar), /WE (write enable bar) and /CS (column select bar), in accordance with an input enable clock signal (CLK_INEN) which is applied from a clock pad 10; a command generating unit 12 generating a refresh control signal REFRCL by combining the controls signals (/RAS, /CAS, /WE, /CS) supplied from the control signal input buffer 11 and synchronizing the resultant signal with a clock signal CLK_CMD applied from the clock pad 10; a row activating unit 13 activating a row operation in accordance with the refresh control signal REFRCL; a row activation controlling unit 14 controlling the row activating unit 13; an internal address counter 15 generating a predetermined internal address signal (HX<0:k>) by synchronizing with a clock signal CLK_XA an internal address increasing signal INCHX which is activated in accordance with the refresh control signal REFRCL; a row pre-decoder 16 decoding the internal address signal (HX<0:k>) to a row address signal (PX<0:n>) of a certain bit in accordance with a control signal INTX supplied from the row activating unit 13; a wordline model signal generating unit 17 generating a wordline model signal WLMODEL in accordance with a timing when an actual wordline is activated according to the refresh control signal REFRCL and a control signal REF_RAS of the row activation controlling unit 14; and a sense amp state predicting unit 18 generating a signal SRSUMD which indicates that a sense amp is sufficiently amplified and outputting the signal SRSUMD to the row activation controlling unit 14, when a predetermined time has elapsed after receiving the wordline model signal WLMODEL from the wordline model signal generating unit 17.

To operate the thusly configured refresh circuit of the conventional SDRAM, first, the control signal input buffer 11 which receives the externally applied /RAS, /CAS, /WE, /CS signals synchronizes the received signals with the input enable signal CLK_INEN supplied from the clock pad 10, thereby outputting the resultant signals /RAS, /CAS, /WE, /CS, and then the command generating unit 12 which generates a command by combining logic values of the signals /RAS, /CAS, /WE, /CS generates the control signal REFRCL for performing the refresh when the signals /RAS, /CAS, /CS are respectively a low level and the signal /WE is a high level, and supplies the refresh control signal REFRCL to the row activating unit 13 and the wordline model signal generating unit 17, respectively.

When receiving the refresh control signal REFRCL, the row activating unit 13 generates and applies a signal REF_ACT to the row activation controlling unit 14 during which the refresh is being performed, and the row activation controlling unit 14 applies the control signal REF_RAS for respectively activating the row activating unit 13 and the wordline model signal generating unit 17 for 1 cycle of the refresh, that is the cycle during which the /RAS signal falls to the low level and again rises to the high level. The row activating unit 13 generates the control signal INTX which controls the row pre-decoder 16 to receive the internal address signal (HX<0:K>), the control signal INTX being supplied to the row pre-decoder 16.

While, the internal address counter 15 synchronizes the signal which is activated in accordance with the refresh control signal REFRCL, that is the internal address increasing signal INCHX for counting up the internal address by 1 bit, with the clock signal CLK_XA in which one clock is enabled when the row activation proceeds, for thereby generating the internal address signal (HX<0:K>) which is supplied to the row pre-decoder 16. Then, the row pre-decoder 16 receives the internal address signal (HK<0:k>) in accordance with the control signal INTX of the row activating unit 13 and decodes the internal address signal (HK<0:k>) to the row address signal (PX<0:n>) of a certain bit, and accordingly the wordline which is selected by the row address signal (PX<0:n>) is on, so that memory cells connected with the selected wordline are refreshed.

When the wordline model signal generating unit 17 which receives the refresh control signal REFRCL of the command generating unit 12 and the control signal REF_RAS of the row activation controlling unit 14 generates the wordline model signal WLMODEL in accordance with the timing when the actual wordline is activated, the sense amp state predicting unit 18 pulses the predetermined signal SRSUMD, when a predetermined time has elapsed after receiving the wordline model signal WLMODEL, that is the point at which the sense amp sufficiently performs the sensing operation. Thus, the row activation controlling unit 14 supplies a control signal CLR_ACT for controlling the row activating unit 13 to reset the corresponding wordline to the row activating unit 13 which generates a reset signal (CLRX<0:n>) for resetting the corresponding wordline. Thus, when the above operation is repeatedly performed until whole wordlines are all selected, all of the SDRAM cells can be refreshed.

However, since the refresh of the conventional SDRAM should be performed for whole memory cells before signal charges accumulated in capacitors of memory cells are emitted and thus it becomes impossible to judge the charge as '1' or '0', the refresh cycle becomes shortened, which results in deterioration of the system performance.

Also, in view of the system application, the refresh is performed with respect to the whole memory cells even though the SDRAM cells are only partially used, which causes a problem of consuming unnecessary electric current.

SUMMARY OF THE INVENTION

Accordingly, the present invention is directed to a refresh circuit for an SDRAM which obviates the problems and disadvantages due to the conventional art.

An object of the present invention is to provide a refresh circuit for an SDRAM which additionally includes a function of selectively refreshing a wordline which is necessary to be refreshed, without providing additional pins to a conventional SDRAM.

To achieve these and other advantages and in accordance with the purpose of the present invention, as embodied and broadly described, there is provided a refresh circuit for an SDRAM which includes: a control signal input buffer for synchronizing externally inputted signals and a column operation control signal with a predetermined clock signal and outputting resultant signals; a command generating unit for generating a first refresh command or a second refresh command by receiving a logic combination signal of the signals supplied from the control signal input buffer in accordance with the column operation control signal; a row activating unit for generating a control signal to activate a row operation in accordance with the first refresh command or the second refresh command; a row activation controlling unit for controlling the row activating unit; an internal address counter for generating a predetermined internal address in accordance with the first refresh command; an external address path for receiving an address of a wordline to be refreshed; a row pre-decoder for receiving the internal address from the internal address counter or the external address supplied via the external address path and decoding the received signal to a row address signal of a predetermined bit; a wordline model signal generating unit for generating a wordline model signal when an actual wordline is selected in accordance with the first or second refresh command; and a sense amp state predicting unit for generating a predetermined signal which indicates a sensing degree of a sense amp after a predetermined time has elapsed from a point when the wordline model signal is inputted.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 3A to 3D are timing diagrams of the refresh circuit for the conventional SDRAM; and FIGS. 4A to 4E are timing diagrams of the refresh circuit for the SDRAM according to the present invention.

DETAILED DESCRIPTION OF THE INVENTION

Reference will now be made in detail to the preferred embodiment of the present invention, examples of which are illustrated in the accompanying drawings.

Figure 1:
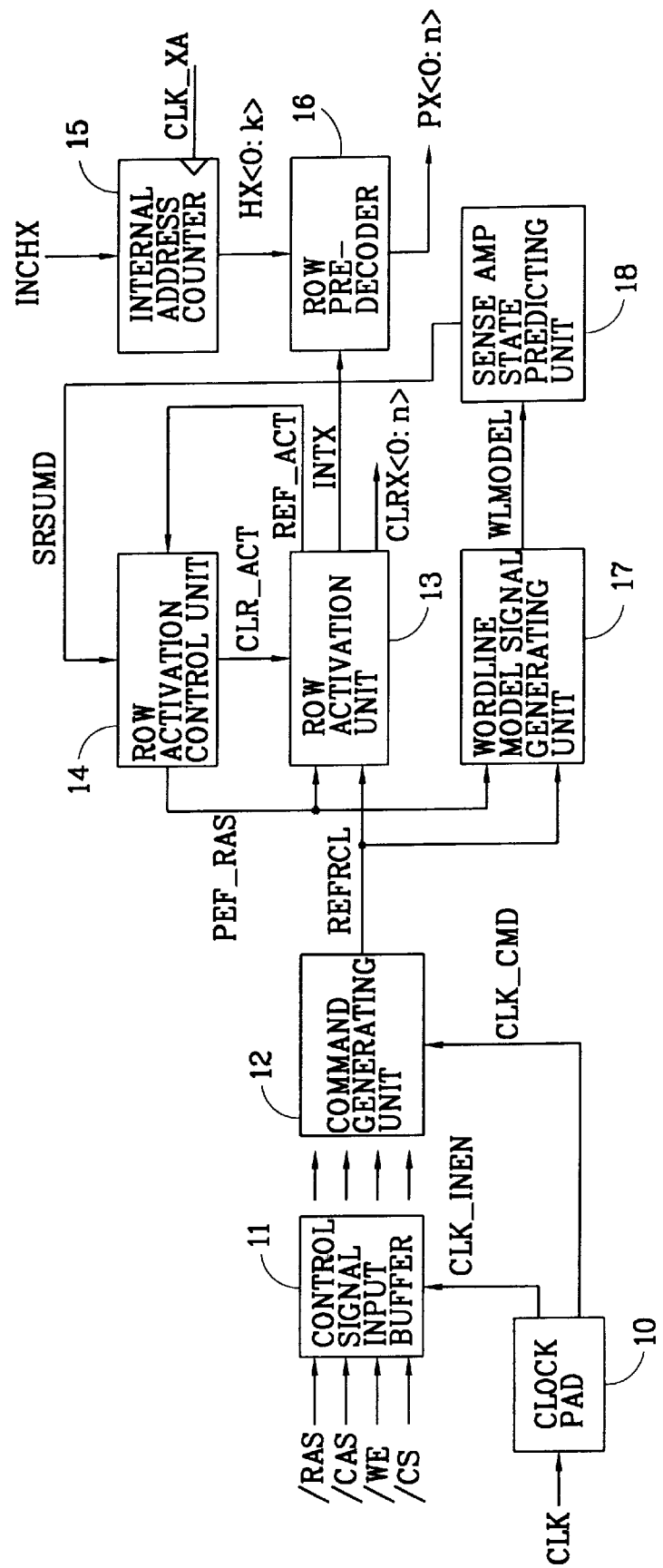
FIG. 1 is a schematic block diagram illustrating a refresh circuit of a conventional SDRAM.
Figure 2:
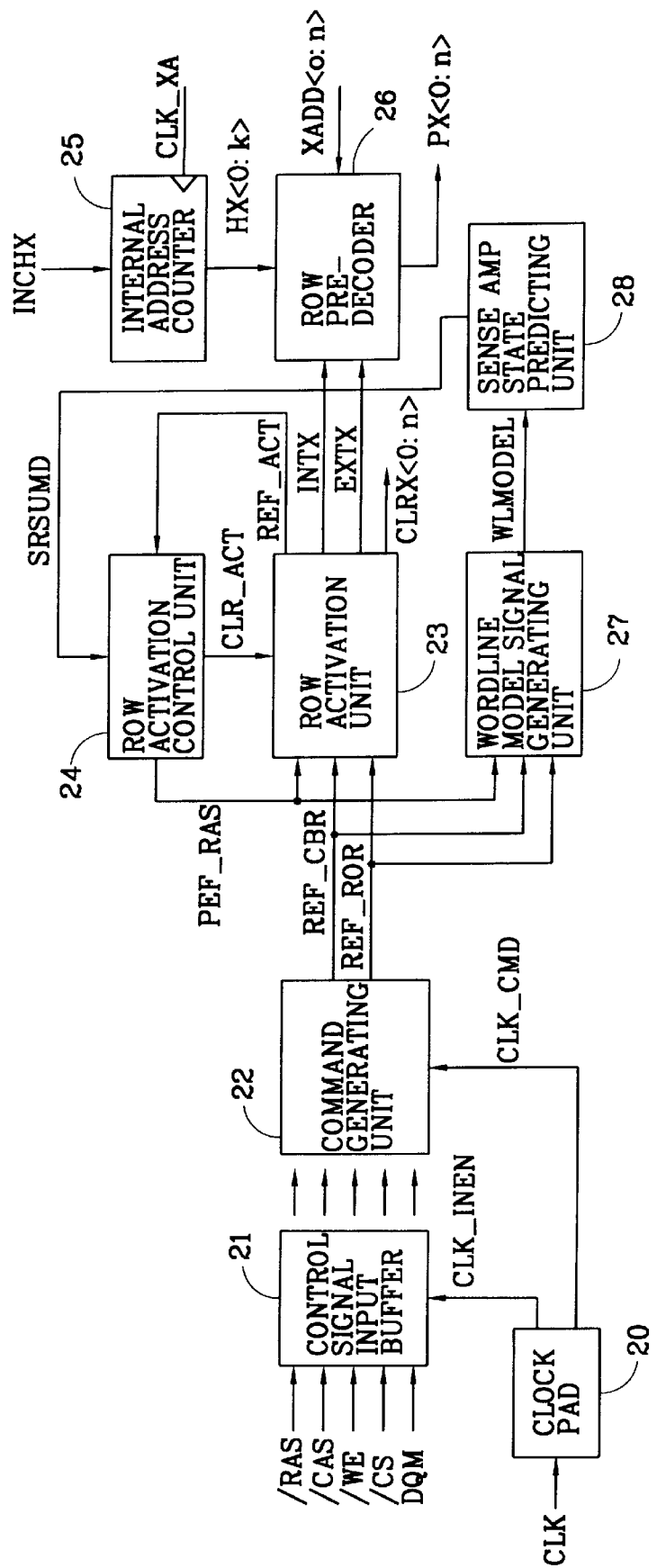
FIG. 2 is a schematic block diagram illustrating a refresh circuit for an SDRAM according to a preferred embodiment of the present invention.

FIG. 2 schematically illustrates a refresh circuit for an SDRAM according to a preferred embodiment of the present invention. As shown therein, the refresh circuit includes: a control signal input buffer 21 outputting /RAS (row address strobe bar), /CAS (column address strobe bar), /WE (write enable bar), /CS (column select bar) and DQM (data mask input), which are externally inputted, in accordance with an input enable clock signal (CLK_INEN) which is supplied from a clock pad 20; a command generating unit 22 generating a first refresh command REF_CBR or a second fresh command REF_ROR by combining the signals (/RAS, /CAS, /WE, /CS, DQM) supplied from the control signal input buffer 21 and synchronizing the resultant signal with a clock signal CLK_CMD supplied from the clock pad 20; a row activating unit 23 activating a row operation in accordance with the first refresh command REF_CBR or the second fresh command REF_ROR; a row activation controlling unit 24 controlling the row activating unit 23; an internal address counter 25 generating a predetermined internal address signal (HX<0:k>) of a certain bit by synchronizing with a clock signal CLK_XA an internal address increasing signal INCHX which is activated in accordance with the first refresh command REF_CBR; a row pre-decoder 26 decoding the internal address signal (HX<0:k>) or an externally applied refresh address (XADD<0:n>) to a row address (PX<0:n>) of a certain bit in accordance with the control of the row activating unit 23; a wordline model signal generating unit 27 generating a wordline model signal WLMODEL in accordance with a timing when an actual wordline is activated according to the first refresh command REF_CBR or the second refresh command REF_ROR and a control signal REF_RAS of the row activation controlling unit 24; and a sense amp state predicting unit 28 generating a signal SRSUMD which indicates that a sense amp is sufficiently amplified and outputting the signal SRSUMD to the row activation controlling unit 24, when a predetermined time has elapsed after a point when the wordline model signal WLMODEL is inputted thereto.

Now, an operation of the thusly configured refresh circuit according to the embodiment of the present invention will be described referring to the accompanying drawings.

According to the embodiment of the present invention, the DQM signal is applied to control a column operation, using a fact that the column operation is not performed during the refresh operation, and to control the column operation the conventional automatic (CBR) refresh or a ROR refresh is performed in accordance with a logic state of the DQM signal, the ROR refresh receiving an external address and refreshing a specific wordline.

For example, the refresh circuit for the SDRAM according to the present invention is controlled to perform the conventional automatic (CBR) refresh when the DQM signal is low, and perform the ROR refresh when the DQM signal is high.

More particularly, the control signal input buffer 21 which receives the externally applied /RAS, /CAS, /WE, /CS, and DQM signals synchronizes the received signals with the input enable signal CLK_INEN supplied from the clock pad 20, thereby outputting the resultant signals /RAS, /CAS, /WE, /CS, DQM and then the command generating unit 22 combines logic values of the signals /RAS, /CAS, /WE, /CS, DOM and thus generates a corresponding command. In other words, the refresh is performed when the signals /RAS, /CAS, /CS are respectively a low level and the signal /WE is a high level. Here, when the DQM signal is the low level, the first refresh command REF_CBR is generated for performing the CBR refresh is the same system as in the conventional art and when the DQM is the high level, the second refresh command REF_ROR is generated in order to perform the ROR refresh, thereby applying the first refresh command REF_CBR or the second refresh command REF_ROR to the row activating unit 23 and the wordline model signal generating unit 27, respectively.

When receiving the first refresh command REF_CBR or the second refresh command REF_ROR, the row activating unit 23 generates and applies a signal REF_ACT to the row activation controlling unit 24, the signal REF_ACT being activated during which the refresh is being performed, and the row activation controlling unit 24 applies the control signal REF_RAS for respectively activating the row activating unit 23 and the wordline model signal generating unit 27 for 1 cycle of the refresh, that is the cycle during which the /RAS signal falls to the low level and again rises to the high level. The row activating unit 23 generates an internal address input signal INTX which controls the row pre-decoder 26 to receive the internal address signal (HX<0:K>) when receiving the first refresh command REF_CBR from the command generating unit 22, while the row activating unit 23 generates an external address input signal EXTX which controls the row pre-decoder 26 to receive an external address signal (XADD<0:n>) when receiving the second refresh command REF_ROR therefrom, the internal address input signal INTX or the external address input signal EXTX being supplied to the row pre-decoder 26.

While, the internal address counter 25, which receives the signal INCHX which is activated in accordance with the first refresh command REF_CBR, that is the signal for counting up the internal address by 1 bit, synchronizes the signal INCHX with the clock signal CLK_XA in which one clock is enabled when the row activation proceeds, for thereby generating the internal address signal (HX<0:K>) which is supplied to the row pre-decoder 26. While, when selectively refreshing the specific wordline, the refresh circuit for the SDRAM of the present invention receives through a conventional row address path the address signal (XADD<0:n>) of the wordline to be refreshed and applies the received address signal (XADD<0:n>) to the row pre-decoder 26.

Then, the row pre-decoder 26 receives the internal address signal (HK<0:k>) from the internal address counter 25 in accordance with the internal address input signal INTX or the external address input signal EXTX of the row activating unit 23 or receives the externally applied refresh address (XADD<0:n>) and decodes the received signal to the row address signal (PX<0:n>) of a certain bit, and accordingly a wordline which is selected by the row address signal (PX<0:n>) is on, so that memory cells connected with the selected wordline are refreshed.

When the wordline model signal generating unit 27 which receives the first or second refresh command REF_CBR, REF_ROR and the control signal REF_RAS of the row activation controlling unit 24 generates the wordline model signal WLMODEL in accordance with the timing when the actual wordline is activated, the sense amp state predicting unit 28 pulses the predetermined signal SRSUMD, when a predetermined time has elapsed after receiving the wordline model signal WLMODEL, that is the point at which it is determined that the sense amp sufficiently performs the sensing operation.

Thus, the row activation controlling unit 24 supplies a control signal CLR_ACT for controlling the row activating unit 23 to reset the corresponding wordline to the row activating unit 23 which generates a reset signal (CLRX<0:n>) for resetting the corresponding wordline, thereby completing the refresh with respect to the corresponding wordline.

FIGS. 3A to 3D and 4A to 4E are timing diagrams for comparing the refresh circuit of the conventional SDRAM with the refresh circuit for the SDRAM according to the present invention. In FIGS. 3A to 3D which illustrates the conventional art, the DMQ signal does not care during which the refresh command is applied and thus the refresh is performed, whereas in FIGS. 4A to 4E which illustrates the refresh circuit for the SDRAM of the present invention when the DQM signal is the low level, the address is not externally applied and only when the DQM signal is the high level, the row address XADD is externally inputted.

As described above, since the refresh circuit for the SDRAM according to the present invention performs the RAS-only-refresh which uses the external address, as well as the conventional automatic refresh, without providing additional pins in the conventional SDRAM, the refresh circuit performs the refresh by selecting the wordlines which are required to be refreshed, thereby reducing a refresh cycle and improving the performance of the system.

It will be apparent to those skilled in the art that various modifications and variations can be made in the refresh circuit for the SDRAM of the present invention without departing from the spirit or scope of the invention. Thus, it is intended that the present invention cover the modifications and variations of this invention provided they come within the scope of the appended claims and their equivalents.

What is claimed is:

1. A refresh circuit for an SDRAM, comprising:
   a control signal input buffer for synchronizing externally inputted signals and a column operation control signal (DQM) with a predetermined clock signal and outputting resultant signals;
   a command generating unit for receiving a logic combination signal of the signals supplied from the control signal input buffer in accordance with the column operation control signal and thus generating a first refresh command or a second refresh command;
   a row activating unit for generating a control signal to activate a row operation in accordance with the first refresh command or the second refresh command;
   a row activation controlling unit for controlling the row activating unit;
   an internal address counter for generating a predetermined internal address in accordance with the first refresh command;
   an external address path for receiving an address of a wordline to be refreshed;
   a row pre-decoder for receiving the internal address from the internal address counter or the external address supplied via the external address path and decoding the received signal to a row address signal of a predetermined bit;
   a wordline model signal generating unit for generating a wordline model signal when an actual wordline is selected in accordance with the first or second refresh command; and
   a sense amp state predicting unit for generating a predetermined signal which indicates a sensing degree of a sense amp after a predetermined time has elapsed from a point when the wordline model signal is inputted.

2. The refresh circuit for the SDRAM according to claim 1, wherein the first refresh command is provided to automatically refresh whole memory cells using the predetermined internal address and the second refresh command is provided to perform the refreshing of the corresponding wordline by externally applying the address to be refreshed.

3. The refresh circuit for the SDRAM according to claim 1, wherein the command generating unit generates the first refresh command or the second refresh command in accordance with a logic value of the column operation control signal when among the externally inputted signals /RAS, /CAS and /CS signals are respectively a low level and a /WE signal is a high level.

4. The refresh circuit for the SDRAM according to claim 1, wherein the row activating unit controls the row pre-decoder to receive the internal address when receiving the first refresh command from the command generating unit and the row activating unit controls the row pre-decoder to receive the external address when receiving the second refresh command therefrom.

5. The refresh circuit for the SDRAM according to claim 1, wherein the row activation controlling unit controls the row activating unit to reset the corresponding wordline when receiving from the sense amp state predicting unit the predetermined signal indicating that the sense amp is sufficiently amplified.

* * * * *